United States Patent [19]
Sasaki

[11] Patent Number: 5,854,555
[45] Date of Patent: Dec. 29, 1998

[54] METHOD AND APPARATUS FOR DETECTING AN ABNORMAL CURRENT IN AUTOMOTIVE WIRING HARNESSES

[75] Inventor: Tohru Sasaki, Hiroshima, Japan

[73] Assignee: Yazaki Corporation, Tokyo, Japan

[21] Appl. No.: 818,041

[22] Filed: Mar. 14, 1997

[30] Foreign Application Priority Data

Mar. 18, 1996 [JP] Japan ........................................ 8-61527

[51] Int. Cl.$^6$ ................................................ G01R 27/26
[52] U.S. Cl. ............................ 324/539; 324/503; 324/66
[58] Field of Search ..................................... 324/503, 539, 324/508, 66

[56] References Cited

U.S. PATENT DOCUMENTS

| | | | |
|---|---|---|---|
| 3,699,438 | 10/1972 | Webb | 324/66 |
| 4,218,745 | 8/1980 | Perkins | 324/66 |
| 4,884,033 | 11/1989 | McConchie | 324/503 |
| 4,959,792 | 9/1990 | Sullivan | 324/555 |
| 5,311,138 | 5/1994 | Ott et al. | 324/503 |
| 5,530,360 | 6/1996 | Kerchaert et al. | 324/503 |
| 5,623,199 | 4/1997 | Taniguchi et al. | 324/539 |
| 5,629,628 | 5/1997 | Hinds et al. | 324/539 |

FOREIGN PATENT DOCUMENTS

60-203551  10/1985  Japan .
60-203552  10/1985  Japan .

*Primary Examiner*—Maura K. Regan
*Attorney, Agent, or Firm*—Armstrong, Westerman, Hattori, McLeland and Naughton

[57] ABSTRACT

A current flowing through the automotive battery and the battery voltage are measured by the battery current measuring means and the battery voltage measuring means. The battery is connected to a plurality of wiring harnesses which in turn connect to a plurality of loads. Data on normal resistance values between the battery and the wiring harnesses as produced by each of the loads being activated are stored and held in the load current data holding means. When the resistance value comparison means determines that the resistance value between the battery and the wiring harnesses calculated by the resistance value calculating means does not agree with the data of normal resistance values between the battery and the wiring harnesses held by the load resistance data holding means and produced by each of the loads being activated, it is decided that abnormal currents are flowing through the wiring harnesses.

8 Claims, 9 Drawing Sheets

METHOD AND APPARATUS FOR DETECTING AN ABNORMAL CURRENT IN AUTOMOTIVE WIRING HARNESSES

BACKGROUND OF THE INVENTION

1. Field of the Invention

The present invention relates to a method and an apparatus for detecting an abnormal current in a plurality of power supply wiring harnesses that connect automotive batteries and a plurality of loads.

2. Description of the Related Art

In motor vehicles including passenger cars, electrical power from the battery is supplied through individual wiring harnesses to a variety of loads made up of electrically powered devices, such as a combination meter consisting of a speedometer and various warning lamps, power windows, and an illumination system including head lights and hazard lamps.

Figure 9:
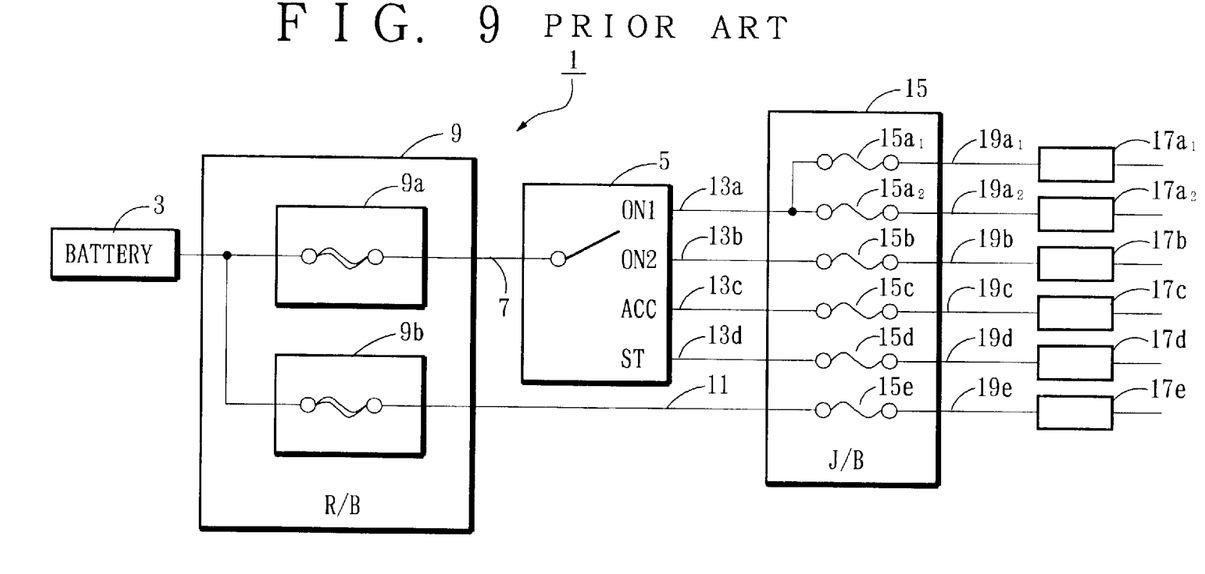
FIG. 9 is a schematic diagram of a conventional automotive power supply system.

FIG. 9 is a schematic diagram of an automotive power supply system showing the connections of conventional wiring harnesses of this kind. In the automotive power supply system generally represented by reference number 1 of FIG. 9, a battery 3 is connected with a trunk harness 7 that supplies loads 17a1, 17a2–17d, which are made operational according to a state of an ignition switch 5. In a relay box 9 the trunk harness 7 is branched into an auxiliary trunk harness 11 that supplies a dark current to a load 17e that is usable at all times irrespective of the state of the ignition switch 5.

The trunk harness 7 is connected to a common contact of the ignition switch 5 downstream of the relay box 9. The ignition switch 5 has its "ACC (accessory)," "ON" (in this case two parallel contacts "ON1" and "ON2") and "START" contacts connected through intermediate harnesses 13a–13d to a joint and fuse box (generally referred to as a joint box) 15. The auxiliary trunk harness 11 branched from the trunk harness 7 is also connected to the joint box 15.

The joint box 15 has small-current fuses 15a1, 15a2–15e for loads 17a1, 17a2 that are made available when the ignition switch 5 is set to the "START" or "ON" contact, for a load 17b that is made available when the switch is at the "START" or "ON" contact, for a load 17c that is made available when the switch is at the "START," "ON" or "ACC" contact, for a load 17d that can be used when the switch is at the "START" contact, and for a load 17e that is continuously supplied a dark current regardless of the contact position of the ignition switch 5. The downstream sides of these small-current fuses 15a1, 15a2–15e are connected to the corresponding loads 17a1, 17a2–17e through branch harnesses 19a1, 19a2–19e.

In the relay box 9 "slow blow" fuses (large-current fuses) 9a, 9b are installed that heat up and open the respective circuits when the currents passing through them exceed predetermined values. The slow blow fuse 9a is installed on the trunk harness 7 at a point downstream of the branch point to the auxiliary trunk harness 11, and the other slow blow fuse 9b is arranged on the auxiliary trunk harness 11.

In such a conventional power supply system 1, when a dead short occurs causing an overcurrent condition, the slow blow fuse 9a is blown by the overcurrent to interrupt current for the trunk harness 7 and the intermediate harnesses 13a–13d, the slow blow fuse 9b is blown to interrupt current for the auxiliary trunk harness 11, and the small-current fuses 15a1, 15a2–15e are blown to interrupt current for the branch harnesses 19a1, 19a2–19e, thus disconnecting the dead short point from the battery 3 and protecting the harnesses 7, 11, 13, 19a1–, 19a 2–19e from damages due to overheating and fires.

In the above conventional power supply system 1 when a so-called rare short-which develops when the insulations of the harnesses 7, 11, 13a–13d, 19a1, 19a2–19e are cracked and their internal core wires are repetitively brought into contact with the car by vibrations during traveling-or a current leakage should occur with these harnesses, an overcurrent may flow through these harnesses which is not so large in magnitude as the dead short but, if left uncorrected, can result in the harnesses being overheated and catching fire.

Because such rare shorts and leaks do not produce an overcurrent of as great a magnitude as dead shorts, there is a possibility that these faults may not be detected until the slow blow fuses 9a, 9b and small-current fuses 15a1, 15a2–15e, both designed to be compatible with the dead shorts, are blown. Considering that the rare shorts and leaks, if left uncorrected, can eventually heat the harnesses 7, 11, 13a–13d, 19a1, 19a2–19e causing them to catch fire, it is desired that a further measure in terms of safety be taken.

The present invention has been accomplished under the circumstances described above and its primary objective is to provide a method and an apparatus for detecting abnormal currents in automotive wiring harnesses, which can reliably detect the occurrence of rare shorts and leakage whose overcurrents are smaller in magnitude than those of dead shorts. A second objective is to provide a method and an apparatus for detecting abnormal currents in automotive wiring harnesses, which can reliably cut off connections between a battery and a wiring harness in which a rare short or leakage that cannot be deal with by the existing fuses designed for the dead short has occurred.

SUMMARY OF THE INVENTION

The present invention relates to a method of detecting an abnormal current in automotive wiring harnesses and to an apparatus for detecting abnormal current in automotive wiring harnesses, respectively.

The method of detecting an abnormal current in automotive wiring harnesses in the present invention, comprises the steps of: measuring currents flowing between an automotive battery and power supply wiring harnesses connecting the battery and a plurality of loads; measuring a voltage of the battery; calculating resistance values between the battery and the wiring harnesses based on the measured current between the battery and the wiring harnesses and the measured battery voltage; and comparing the calculated resistance values between the battery and the wiring harnesses with data regarding normal resistance values between the battery and the wiring harnesses as produced by each of the loads being activated, to determine whether any abnormal current is flowing in the wiring harnesses.

According to the present invention, resistance values between the battery and the wiring harnesses, which are calculated based on the currents between the battery and the wiring harnesses and the battery voltage, each measured when each of the loads is activated, are collected as the resistance value data during a predetermined period and, after the end of the period, a check is performed based on the collected resistance value data to determine whether any abnormal current is flowing in the wiring harnesses.

According to the present invention, the normal resistance value data between the battery and the wiring harnesses as produced by each of the loads being activated are used as resistance values of each of the loads; currents of each of the wiring harnesses are measured; based on the measured currents of the wiring harnesses and the measured battery voltage, resistance values of each of the wiring harnesses connected to the activated loads as produced by each of the loads being activated are calculated as resistance values between the battery and the wiring harnesses; and the calculated resistance values of the wiring harnesses connected to the activated loads and produced by each of the loads being activated are compared with the resistance values of the activated loads to determine whether any abnormal current is flowing in the wiring harnesses.

According to the present invention, when it is decided that abnormal currents are flowing through the wiring harnesses, the wiring harnesses through which the abnormal currents are flowing are electrically cut off from the battery.

Figure 1:
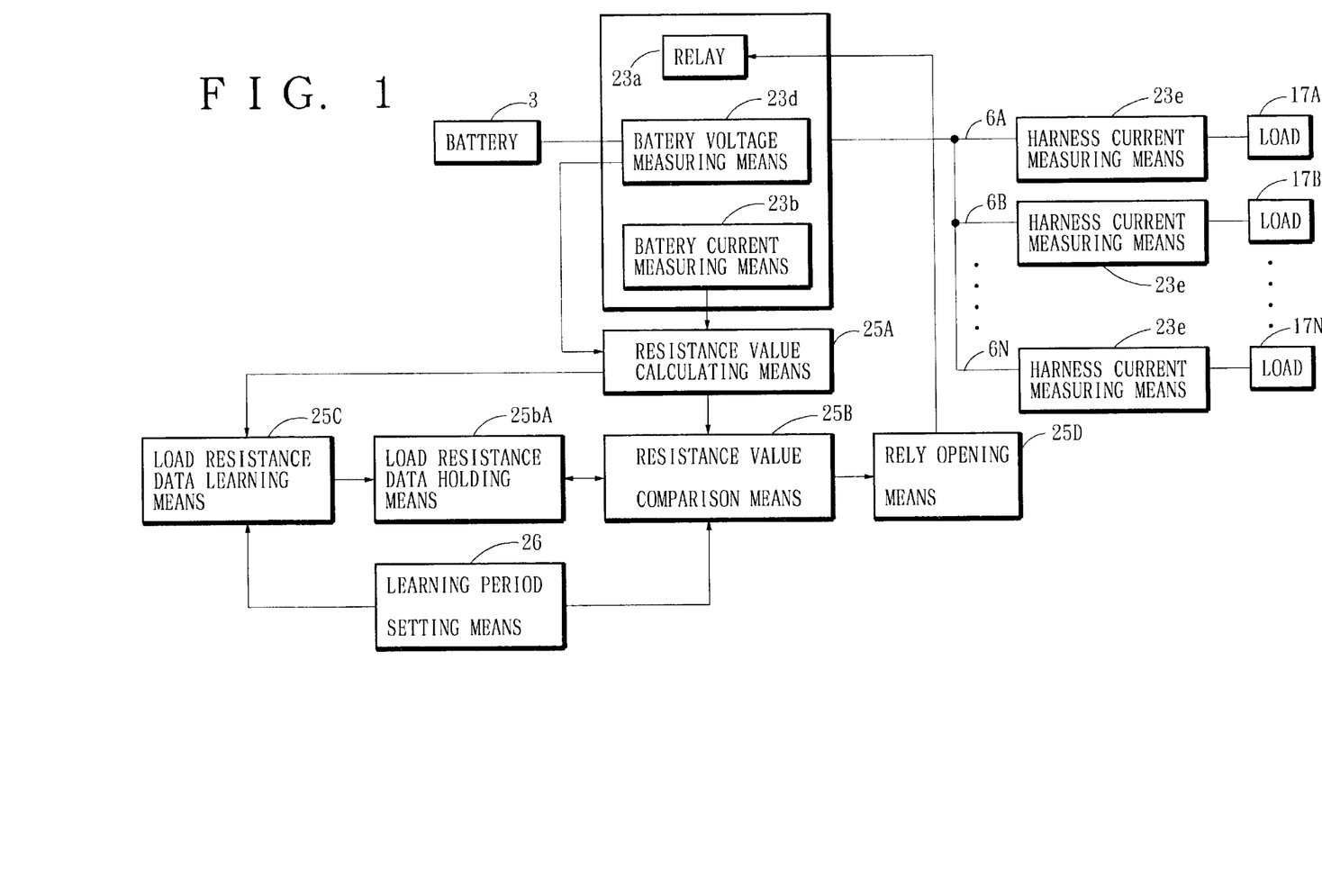
FIG. 1 is a block diagram showing a basic configuration of an abnormal current detecting apparatus for automotive wiring harnesses of this invention.

According to the present invention, the apparatus for detecting an abnormal current in automotive wiring harnesses comprises, as shown in the basic configuration diagram of FIG. 1: a battery current measuring means 23b for measuring currents A flowing between an automotive battery 3 and power supply wiring harnesses 6A–6N connecting the battery 3 and a plurality of loads 17A–17N; a battery voltage measuring means 23d for measuring a voltage of the battery 3; a resistance value calculating means 25A for calculating resistance values R between the battery 3 and the wiring harnesses 6A–6N based on the measured currents of the battery current measuring means 23b and the measured voltage of the battery voltage measuring means 23d; a load resistance data holding means 25bA for storing and holding data on normal resistance values between the battery 3 and the wiring harnesses 6A–6N as produced by each of the loads 17A–17N being activated; and a resistance value comparison means 25B for determining whether the resistance values R between the battery 3 and the wiring harnesses 6A–6N calculated by the resistance value calculating means 25A match the data on the normal resistance values between the battery 3 and the wiring harnesses 6A–6N as produced by each of the loads 17A–17N being activated; wherein when the resistance value comparison means 25B determines that the resistance values R between the battery 3 and the wiring harnesses 6A–6N calculated by the resistance value calculating means do not agree with the data on the normal resistance values between the battery 3 and the wiring harnesses 6A–6N as produced by each of the loads 17A–17N being activated, it is decided that an abnormal current is flowing through at least one of the wiring harnesses 6A–6N.

According to the present invention the apparatus for detecting an abnormal current in automotive wiring harnesses comprises: a learning period setting means 26 for setting a period of learning; and a load resistance data learning means 25C for storing into the load resistance data holding means 25bA the resistance values R between the battery 3 and the wiring harnesses 6A–6N calculated during the learning period by the resistance value calculating means 25A and produced by each of the loads 17A–17N being activated; wherein the resistance value comparison means 25B determines after the learning period whether or not the resistance values R between the battery 3 and the wiring harnesses 6A–6N calculated by the resistance value calculating means 25A agree with the data on the normal resistance values between the battery 3 and the wiring harnesses 6A–6N as produced by each of the loads 17A–17N being activated and held by the load resistance data holding means 25bA.

According to the present invention, the data held by the load resistance data holding means 25bA are resistance values of each of the loads 17A–17N, and the resistance value comparison means 25B determines whether or not the resistance values R between the battery 3 and the wiring harnesses 6A–6N calculated by the resistance value calculating means 25A agree with the resistance values of the loads 17A–17N held by the load resistance data holding means 25bA.

The present invention further includes: a relay 23a interposed between the battery 3 and the wiring harnesses 6A–6N and which is made conductive when the resistance values R between the battery 3 and the wiring harnesses 6A–6N are normal; and a relay opening means 25D for opening the relay 23a when the resistance value comparison means 25B determines that the resistance values R between the battery 3 and the wiring harnesses 6A–6N calculated by the resistance value calculating means 25A do not agree with the data on the normal resistance values between the battery 3 and the wiring harnesses 6A–6N held by the load resistance data holding means 25bA and produced by each of the loads 17A–17N being activated.

According to the claim 1 of this invention, the resistance values between the automotive battery and a plurality of wiring harnesses-which in turn are connected to a plurality of loads-are not affected by voltage fall of the battery or battery voltage variations due to environmental changes such as ambient temperature changes but are determined uniquely according to the activated loads.

Thus, when a resistance value between the battery and the wiring harnesses changes, the changed resistance value is compared with the data of normal resistance values between the battery and the wiring harnesses as produced by each of the loads being activated. This comparison makes it possible to correctly determine whether the resistance change is a result of the activation of a load or a result of occurrence of anomaly in the wiring harnesses such as a rare short or leakage, without being influenced by the battery conditions such as battery voltage fall or battery voltage variations caused by environmental changes such as ambient temperature changes.

According to the present invention, in a predetermined period each of the loads is automatically activated to measure currents between the battery and the wiring harnesses and the battery voltage and, based on these measured currents and battery voltage, resistance values between the battery and the wiring harnesses are automatically calculated and stored as data of normal resistance values between the battery and the wiring harnesses as produced by each of the loads being activated. This obviates the need to prepare and store beforehand the data on resistance values as produced by each of the loads being activated.

According to the present invention, because the resistance values of the load are used as the decision criteria for determining whether or not an abnormal current is flowing through the wiring harnesses connected to the loads, the data required for reliably checking the occurrence of abnormal conditions such as a rare short or leakage includes only the resistance value data of the loads and is thus made simple and small in volume. In addition, it is possible to reliably detect anomalies, such as rare shorts or leakage, occurring in the wiring harnesses connected to the loads without being affected by the battery conditions.

According to the present invention, the electrical disconnection between the battery and a plurality of loads, which has here to force been possible only in the event of a dead short, can also be achieved when other anomalies of less severity occur, thus reliably preventing wiring harnesses from being damaged due to rare shorts or leakage.

DETAILED DESCRIPTION OF THE PREFERRED EMBODIMENTS

The abnormal current detection method for automotive wiring harnesses according to the present invention will be described in conjunction with the abnormal current detection apparatus for automotive wiring harness by referring to the accompanying drawings.

Figure 2:
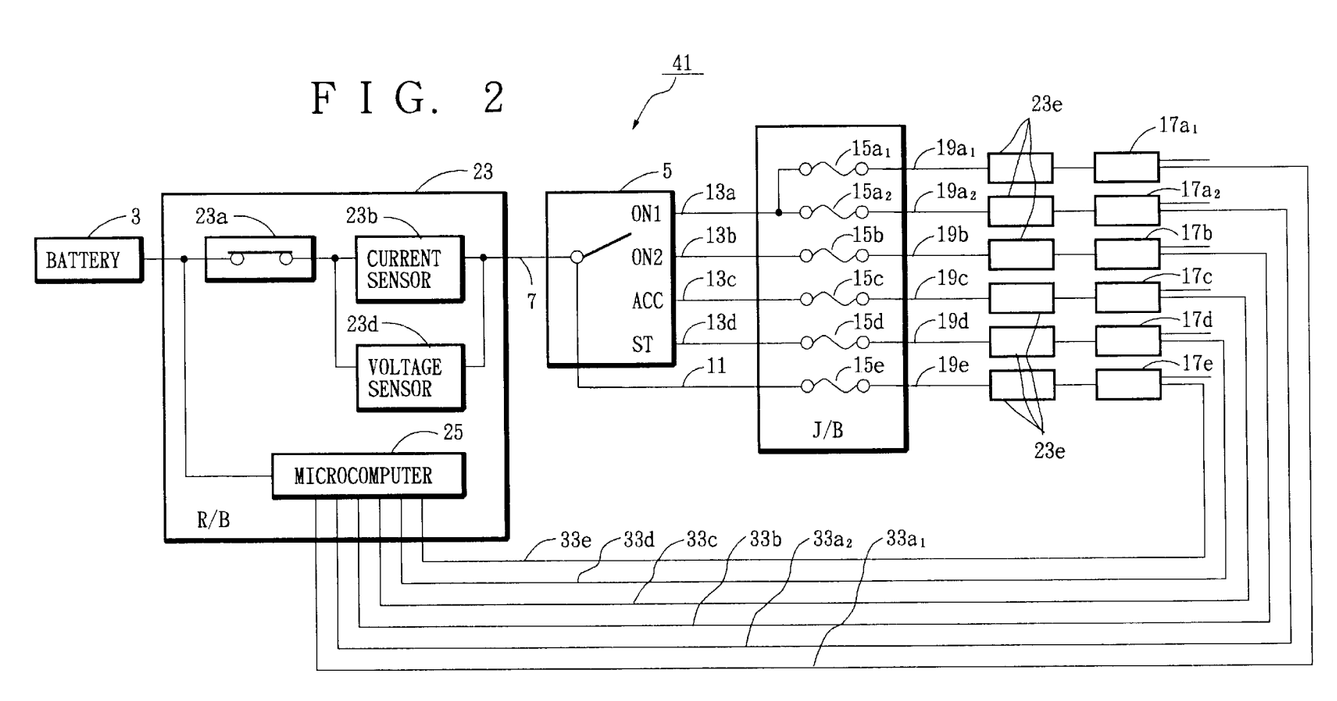
FIG. 2 is a schematic diagram showing an automotive power supply system having one embodiment of the abnormal current detecting apparatus of this invention.

FIG. 2 is a schematic diagram of an automotive power supply system that is provided with one embodiment of an abnormal current detection apparatus of this invention. In FIG. 2, parts identical with those of FIG. 9 are assigned the same reference numerals, and their explanations will be omitted.

The power supply system of this embodiment generally denoted by reference number 41 in FIG. 2 differs from the conventional power supply system 1 of FIG. 9 in the following points. First, the slow blow fuse 9a installed on the trunk harness 7 in the relay box 23 is replaced by a main relay 23a. Another difference is that a conventionally known current sensor 23b (which corresponds to a battery current measuring means) that measures current flowing in the battery 3 and a conventionally known voltage sensor 23d (which corresponds to a battery voltage measuring means) that measures voltage of the battery 3 are installed in the relay box 23 and are connected in parallel with each other at a point on the trunk harness 7 on the ignition switch 5 side of the main relay 23a.

The power supply system 41 of this embodiment further differs from the conventional power supply system 1 of FIG. 9 in that conventionally known current sensors 23e (which correspond to harness current measuring means) that measure currents in individual branch harnesses 19a1, 19a2–19e are connected at points on the branch harnesses 19a1, 19a2–19e on the joint box 15 side of the loads 17a1, 17a2–17e.

Further, the power supply system 41 of this embodiment differs from the conventional power supply system 1 of FIG. 9 in that a microcomputer 25, that controls the open-close operation of the main relay 23a according to the current of the battery 3 measured by the current sensor 23b or to the currents of the branch harnesses 19a1, 19a2–19e measured by the current sensors 23e, is installed in the relay box 23; and in that the auxiliary trunk harness 11 branching from the trunk harness 7 in the relay box 23 is connected to a terminating end of the trunk harness 7 that is connected to the common contact of the ignition switch 5.

Figure 3:
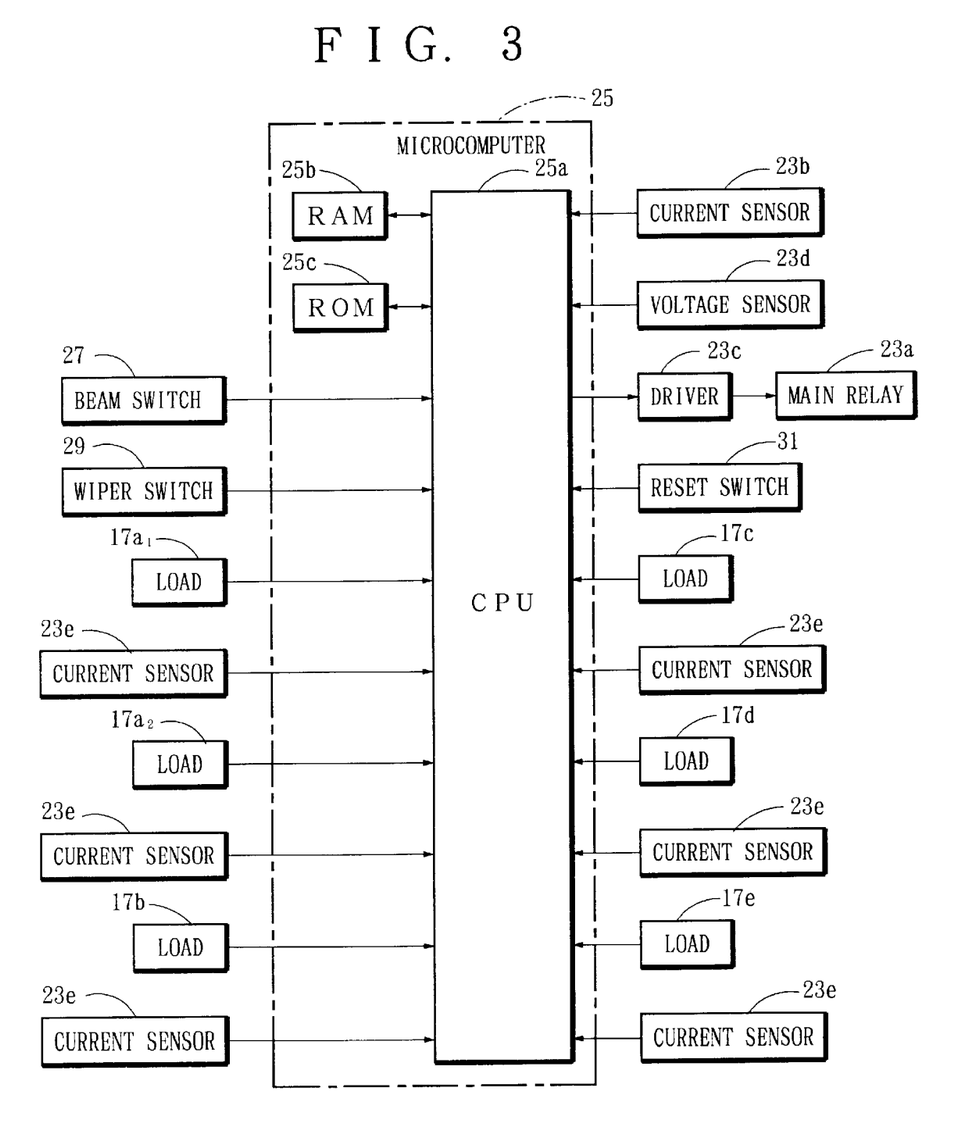
FIG. 3 is a block diagram showing a configuration of the microcomputer shown in FIG. 2.

The microcomputer 25, as shown in the electrical configuration block diagram of FIG. 3, comprises a CPU (Central Processing Unit) 25a, a RAM (Random Access Memory) 25b, and a ROM (Read-Only Memory) 25c. This microcomputer 25 is supplied from a DC/DC converter not shown on the microcomputer 25 side of the current sensors 23e.

The CPU 25a is connected with the RAM 25b and the ROM 25c. It is also connected with a driver 23c of the main relay 23a, the current sensor 23b and the current sensors 23e, the voltage sensor 23d, a beam switch 27 of head lights (not shown) and a wiper switch 29, and a reset switch 31.

Further, the CPU 25a is connected with signal lines 33a1 33a2–33e to retrieve the working or rest state of the loads 17a1, 17a2–17e (e.g., open or closed state of switches).

Figure 4:
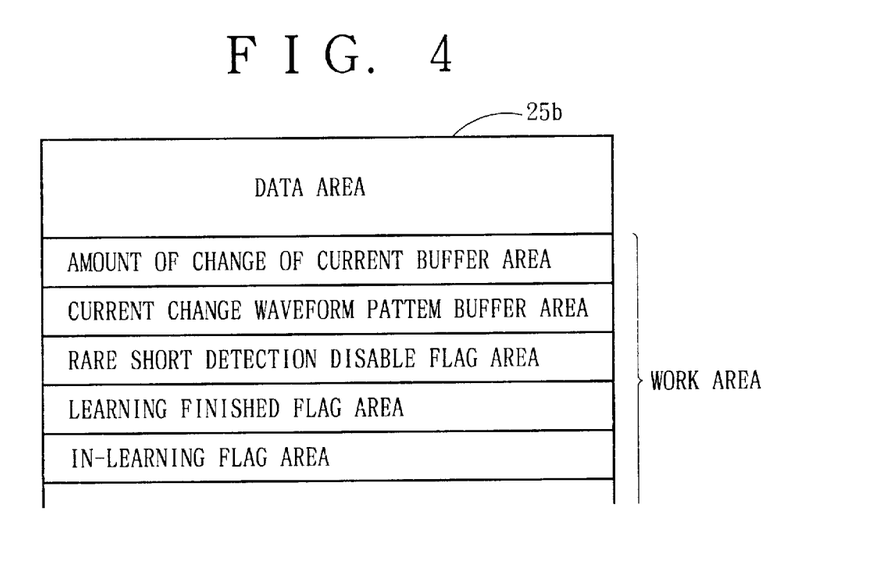
FIG. 4 is a memory area map of the RAM shown in FIG. 3.

The RAM 25b, as shown in the memory area map of FIG. 4, has a data area in which are stored a variety of data used as decision criteria for detecting rare shorts, leakage and dead shorts, and a work area used to perform a variety of processing. The work area includes an overall resistance value buffer, a buffer for individual harness resistance values, a rare short detection disable flag, a learning end flag and a learning in-progress flag.

The ROM 25c contains a control program necessary for the CPU 25a to perform a variety of processing.

Next, the processing that the CPU 25a performs according to the control program stored in the ROM 25c will be described by referring to the flow chart of FIG. 5 to FIG. 8.

The microcomputer 25, upon being connected to and supplied from the battery 3, starts processing the program. As shown in the main routine flow chart of FIG. 5, the CPU 25a first performs an initial setting (step S1).

Figure 5:
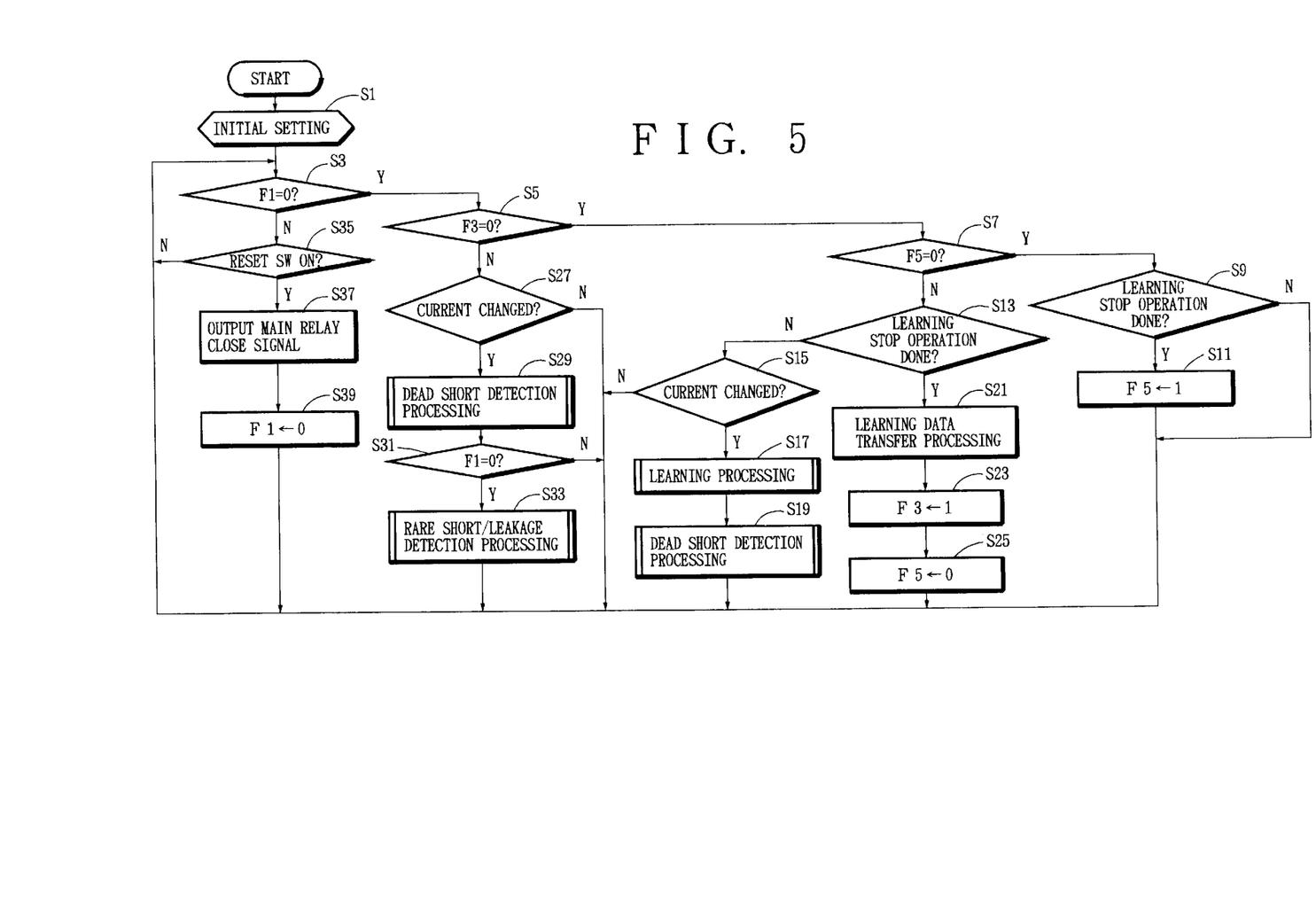
FIG. 5 is a flow chart of a main routine performed by the CPU according to a control program stored in the ROM shown in FIG. 3.

The initial setting at step S1 clears the overall resistance value buffer area and the individual harness resistance value buffer area in the RAM 25b and also sets to "0" a flag F1 in the rare short detection disable flag area, a flag F3 in the learning finished flag area and a flag F5 in the learning in-progress flag area.

After the initial setting at step S1 is finished, a check is made to see whether the flag F1 in the rare short detection disable flag area in the RAM 25b is "0" (step S3). If the flag F1 is not "0" (N in step S3), the program proceeds to step S35, which is described later. If it is "0" (Y in step S3), the program checks whether the flag F3 in the learning finished flag area in the RAM 25b is "0" (step S5).

When the flag F3 in the learning finished flag area is not "0" (N in step S5), the program goes to step S27. When it is "0" (Y in step S5), the program checks whether the flag F5 in the learning in-progress flag area in the RAM 25b is "0" (step S7). If the flag F5 is not "0" (N in step S7), the program moves to step S13 to be described later. If it is "0" (Y in step S7), the program checks if an operation has been performed that represents the start of learning and which is specially combined operations, not normally carried out, of the beam switch 27 and the wiper switch 29 (step S9).

If the learning start operation is found not performed (N in step S9), the processing returns to step S3. If the learning start operation is found to have been performed (Y in step S9), the processing sets the flag F5 to "1" (step S11) before returning to step S3.

The step S13, to which the program moves when at step S7 the flag F5 in the learning in-progress flag area is not "0" (N), checks whether an operation has been performed that represents the end of learning and which is specially combined operations, not normally carried out, of the beam switch 27 and the wiper switch 29 and is different from the learning start operation. If the learning stop operation is found to have been performed (Y in step S13), the program goes to a step S21 described later. If not (N in step S13), the program checks whether there is any change in the current value from the current sensor 23b (step S15).

When there is no change in the current value (N in step S15), the processing returns to step S3. When a change is found (Y in step S15), a learning processing is performed (step S17).

Figure 6:
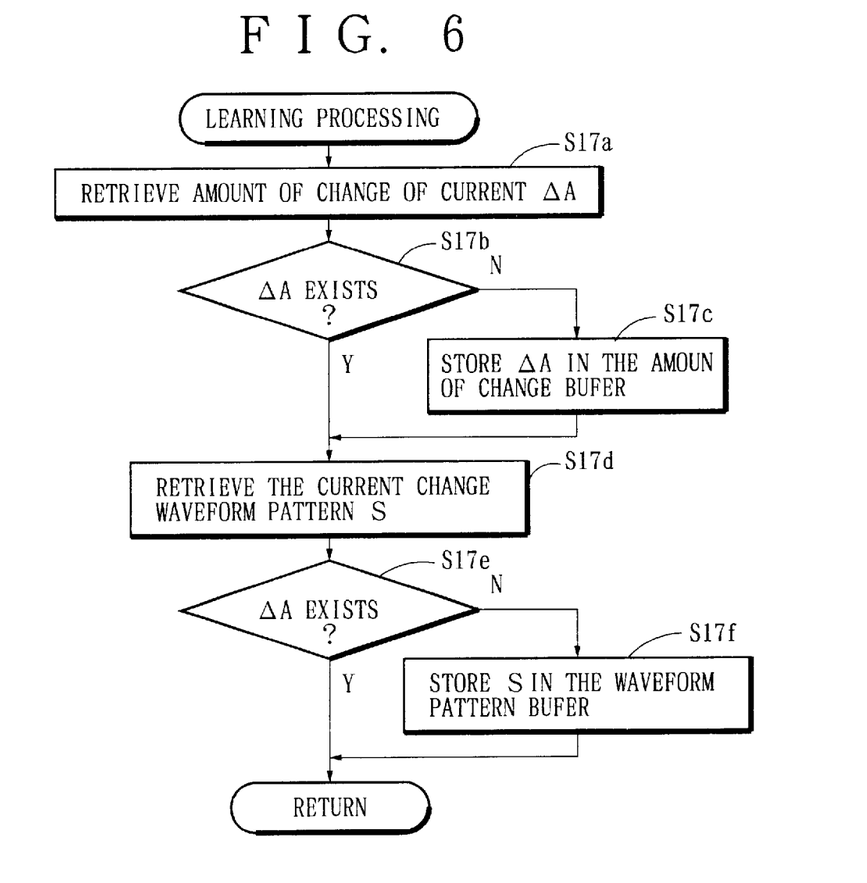
FIG. 6 is a flow chart of a subroutine showing the learning processing of FIG. 5.

The learning processing at step S17, as shown in the subroutine flow chart of FIG. 6, identifies activated loads 17a1, 17a2–17e according to status changes in input signals from the signal lines 33a1 33a2–33e (step S17a) and then checks whether data having the same titles as the identified loads 17a1, 17a2–17e are stored both in the overall resistance value buffer area and the individual harness resistance value buffer area in the RAM 25b (step S17b).

When data having the same title as the identified loads 17a1, 17a2–17e are stored in both areas of the overall resistance value buffer and the individual harness resistance value buffer (Y in step S17b), the program returns to the main routine at step S19. When the data are not stored in these areas (N in step S17b), the program proceeds to step S17c where it retrieves a current which was found to have changed at step S15, i.e., a current value A of the trunk harness 7 sent from the current sensor 23b after the current change, and then retrieves current values Aa1, Aa2–Ae from the current sensors 23e of the branch harnesses 19a1, 19a2–19e connected to the activated loads 17a1, 17a2–17e identified by step S17a (step S17d).

Next, the program performs calculations, which involve dividing the voltage of the battery 3 retrieved from the voltage sensor 23d by the current value A of the trunk harness 7 retrieved at step S17c to determine a resistance value R of the power supply system 41 (step S17e) and dividing the voltage of the battery 3 retrieved from the voltage sensor 23d by the current values Aa1, Aa2–Ae of the branch harnesses 19a1, 19a2–19e to determine resistance values Ra1, Ra2–Re of the branch harnesses 19a1, 19a2–19e. Then, the program links these resistance values R, Ra1, Ra2–Re to the names, codes or numbers of the loads 17a1, 17a2–17e identified by the step S17a and stores them in the current change buffer area in the RAM 25b before returning to the main routine at step S19 (step S17f).

The step S19, to which the processing moves after finishing the learning processing at step S17, performs a dead short detection processing to check whether a dead short has occurred in the trunk harness 7, auxiliary trunk harness 11, intermediate harnesses 13a–13d and branch harnesses 19a1, 19a2–19e, as shown in FIG. 5.

Figure 7:
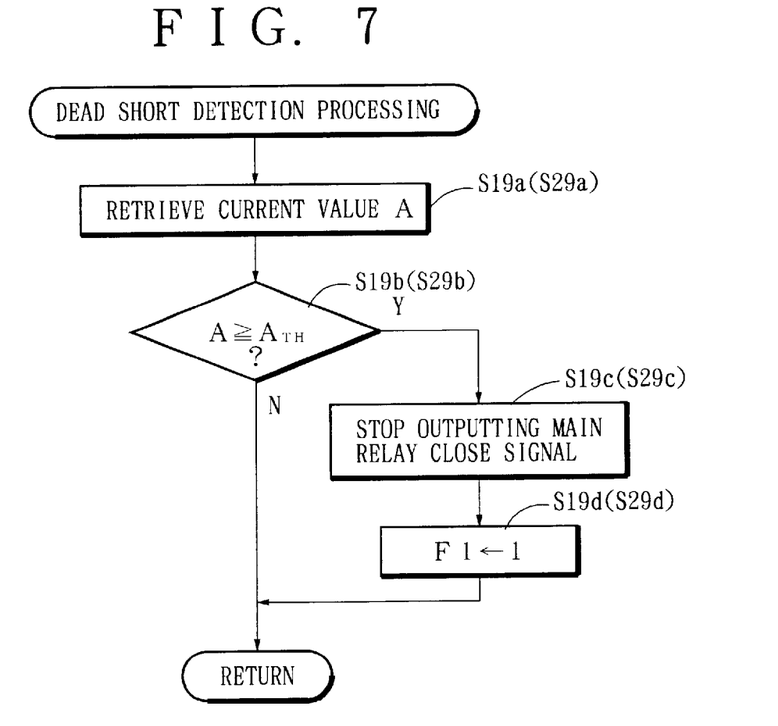
FIG. 7 is a flow chart of a subroutine showing a dead short detection processing of FIG. 5.

The dead short detection processing at step S19, as shown in the subroutine flow chart of FIG. 7, retrieves the current value A from the current sensor 23b and divides the voltage of the battery 3 taken from the voltage sensor 23d by the current value A to determine the resistance value R of the power supply system 41 (step S19a). This dead short detection processing further checks whether or not the resistance value R thus obtained is equal to or lower than a threshold resistance value RTH, the decision criterion for the dead short occurrence which is smaller than the normal resistance values of the branch harnesses 19a1, 19a2–19e at time of activation of the loads 17a1, 17a2–17e (step S19b).

When the resistance value R, calculated from the current value A and battery voltage taken from the current sensor 23b and voltage sensor 23d, is not equal to or lower than the threshold resistance value RTH (N in step S19b), the program returns to the main routine at step S3. When the resistance value R is equal to or lower than the threshold resistance value RTH (Y in step S19b), the program stops the output of a main relay closing signal used to close the main relay 23a for the driver 23c (step S19c) and then sets the flag F1 in the rare short detection disable flag area to "1" (step S19d) before returning to the main routine at step S3.

In step S21, to which the program moves after the learning stop operation is performed at step S13 (Y), a learning data transfer processing is done, as shown in FIG. 5, to transfer to the data area in the RAM 25b the resistance R stored in the overall resistance value buffer area and the resistance values Ra1, Ra2–Re stored in the individual harness resistance value buffer area and clear the overall resistance value buffer area and the individual harness resistance value buffer area. This is followed by the flag F3 in the learning finished flag area being set to "1" (step S23) and the flag F5 in the learning in-progress flag area being set to "0" (step S25). After this, the program returns to step S3.

Further, in step S27, to which the program goes when at step S5 the flag F3 in the learning finished flag area is not "0" (N), the program checks whether the current retrieved from the current sensor 23b has changed and, if no change is found (N in step S27), returns to step S3. If there is a change (Y in step s27), the program performs a dead short detection processing (step S29).

Like step S19, the dead short detection processing at step S29 retrieves, as shown in FIG. 7, the current value A from the current sensor 23b and divides the voltage of the battery 3 taken from the voltage sensor 23d by the current value A to determine the resistance value R of the power supply system 41 (step S29a). This dead short detection processing further checks whether or not the resistance value R thus obtained is equal to or lower than a threshold resistance value RTH, the decision criterion for the dead short occurrence which is smaller than the normal resistance values of the branch harnesses 19a1, 19a2–19e at time of activation of the loads 17a1, 17a2–17e (step S29b).

When the resistance value R, calculated from the current value A and battery voltage taken from the current sensor 23b and voltage sensor 23d, is not equal to or lower than the threshold resistance value RTH (N in step S29b), the program returns to the main routine at step S31. When the resistance value R is equal to or lower than the threshold resistance value RTH (Y in step S29b), the program stops the output of a main relay closing signal used to close the main relay 23a for the driver 23c (step S29c) and then sets the flag F1 in the rare short detection disable flag area to "1" (step S29d) before returning to the main routine at step S31.

The step 31, to which the program moves after the dead short detection processing is finished at step S29, checks whether or not the flag F1 in the rare short detection disable flag area is "0" as shown in FIG. 5. When the flag F1 is not "0" (N in step S31), the program returns to step S3. When it is "0" (Y in step S31), the program performs a rare short/leakage detection processing to check whether a rare short or leakage has occurred in the trunk harness 7, auxiliary trunk harness 11, intermediate harnesses 13a–13d and branch harnesses 19a1, 19a2–19e (step S33).

Figure 8:
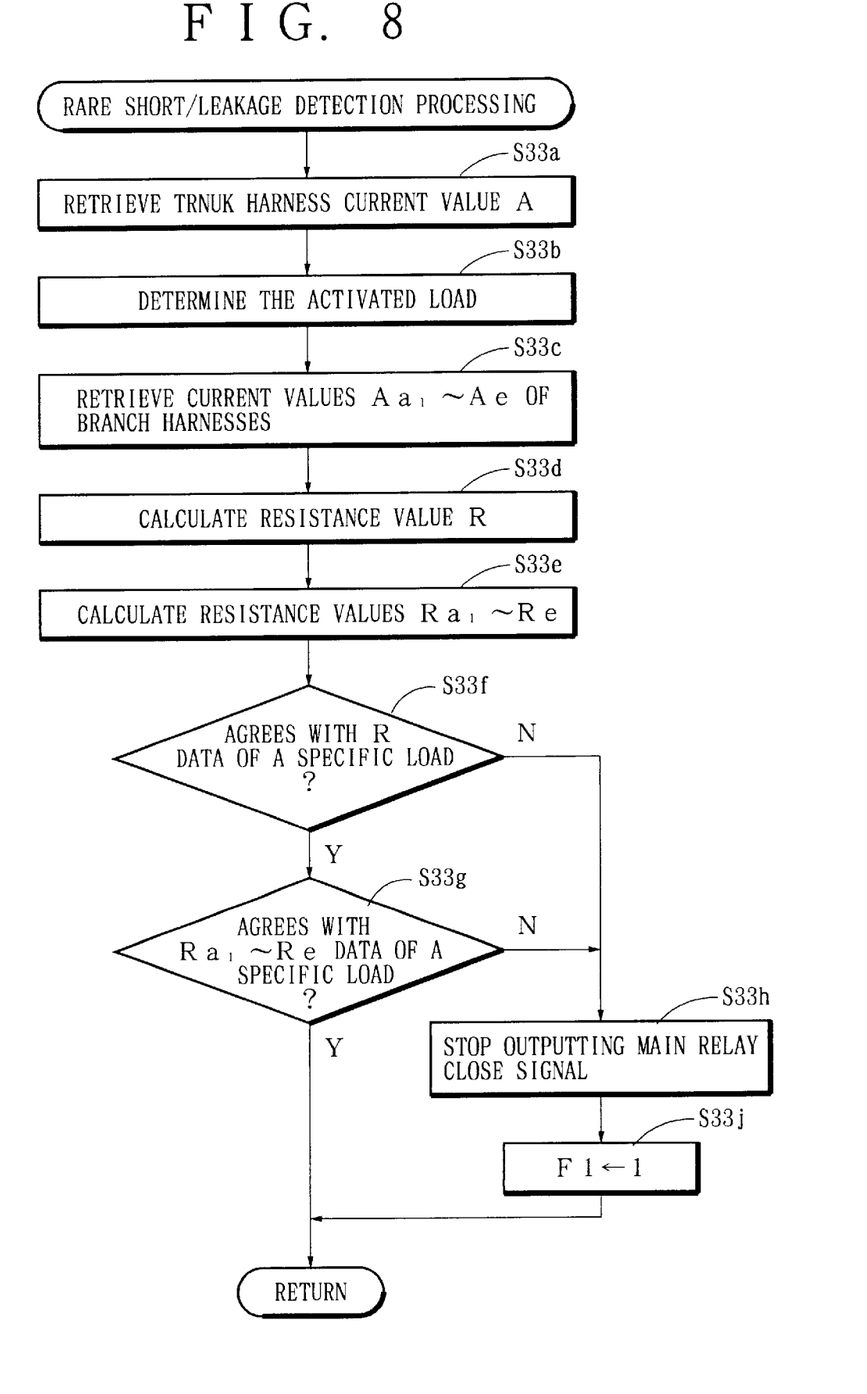
FIG. 8 is a flow chart of a subroutine showing a rare short and leakage detection processing of FIG. 5.

The rare short/leakage detection processing at step S33, as shown in the subroutine flow chart of FIG. 8, retrieves a current value that was found to have changed at step S27, i.e., the current value A of the trunk harness 7 from the current sensor 23b after the change (step S33a).

Next, according to the status changes in the input signals from the signal lines 33a, 1 33a2–33e, activated loads 17a1, 17a2–17e are identified (step S33b) and current values Aa1, Aa2–Ae of the branch harnesses 19a1, 19a2–19e connected to the identified loads 17a1, 17a2–17e are retrieved from the current sensors 23e (step S33c).

Next, the voltage of the battery 3 retrieved from the voltage sensor 23d is divided by the current value A of the trunk harness 7 retrieved at step S33a to determine a resistance value R of the power supply system 41 (step S33d). Then, the voltage of the battery 3 retrieved from the voltage sensor 23d is also divided by the current values Aa1, Aa2–Ae of the branch harnesses 19a1, 19a2–19e to determine resistance values Ra1, Ra2–Re (step S33e).

Then, a search is made through the data area of the RAM 25b for the data on the resistance value R of the power supply system 41 with the titles of the loads 17a1, 17a2–17e identified by the step S33b. Then a check is made to see if the searched data of the resistance value R agrees with the resistance value R of the power supply system 41 calculated by step S33d (step S33f).

When the resistance value R of the power supply system 41 calculated by step S33d does not agree with the resistance value R retrieved from the data area of the RAM 25b (N in step S33f), the program proceeds to step S33h described later. When they agree (Y in step S33f), the program searches through the data area of the RAM 25b for the data on the resistance values Ra1, Ra2–Re of the branch harnesses 19a1, 19a2–19e with the titles of the loads 17a1, 17a2–17e identified by step S33b and checks whether the searched data of the resistance values Ra1, Ra2–Re agrees with the resistance values Ra1, Ra2–Re of the branch harnesses 19a1, 19a2–19e calculated by step S33e (step S33g).

When the resistance values Ra1, Ra2–Re of the branch harnesses 19a1, 19a2–19e calculated by step S33e agrees with the resistance values Ra1, Ra2–Re retrieved from the data area of the RAM 25b (Y in step S33g), the program returns to the main routine at step S3. When they do not agree (N in step S33g), the program stops the output of the main relay closing signal used to close the main relay 23a for the driver 23c (step S33h) and sets the flag F1 in the rare short detection disable flag area to "1" (step S33j) before returning to the main routine at step S3.

The step S35, to which the program moves when the flag F1 in the rare short detection disable flag area is found not "0" at step S3, checks whether the reset switch 31 was operated, as shown in FIG. 5. When the reset switch 31 is found not operated (N in step S35), the program returns to step S3. When the reset switch is found operated (Y in step S35), the program outputs a main relay closing signal to the driver 23c for the main relay 23a (step S37) and then sets the flag F1 in the rare short detection disable flag area to "0" (step S39) before returning to the main routine at step S3.

As can be seen from the above explanation, in this embodiment, the trunk harness 7, auxiliary trunk harness 11, intermediate harnesses 13a–13d and branch harnesses 19a1, 19a2–19e together form wiring harnesses 6A–6N in the claim of this invention; the loads 17a1, 17a2–17e correspond to loads 17A–17N in the claim; the beam switch 27 and wiper switch 29 form a learning session setting means 26 in the claim; and the main relay 23a and its driver 23c, current sensors 23b, 23e, voltage sensor 23d, microcomputer 25, beam switch 27 and wiper switch 29 combine to form an abnormal current detection apparatus.

Further, in this embodiment, a load resistance START data holding means 25b A in the claim is formed of a data area of the RAM 25b; and a resistance value calculating means 25A comprises the step S17e and S17f in the flow chart of FIG. 6 and the step S33c and S33e in the flow chart of FIG. 8.

Furthermore, in this embodiment, a resistance value checking means 25B in the claim comprises the step S33f and S33g in FIG. 8; a load resistance data learning means 25C in the claim comprises the step S17b and S17g in FIG. 6; and a relay opening means 25D in the claim comprises the step S33h in FIG. 8.

Next, the operation (workings) of the abnormal current detection apparatus of the above embodiment will be described.

Before a car that has rolled out of the assembly line is subjected to a final running test prior to shipping, the RAM 25b in the microcomputer 25 does not contain any data on the resistance value R of the power supply system 41 produced as a result of activation of loads 17a1, 17a2–17e and on the resistance values Ra1, Ra2–Re of the branch harnesses 19a1, 19a2–19e connected to the activated loads 17a1, 17a2–17e, these data forming decision criteria for determining whether or not a rare short or leakage has occurred in the trunk harness 7, auxiliary trunk harness 11, intermediate harnesses 13a–13d and branch harnesses 19a1, 19a2–19e.

Thus, a learning start operation is first performed by a special combination of operations of the beam switch 27 and the wiper switch 29 to notify the microcomputer 25 of the start of the learning session.

Before the start of the learning session is notified to the microcomputer 25, only a dead short detection is performed by checking whether the resistance value R-which was obtained by dividing the voltage of the battery 3 from the voltage sensor 23d with the current value A retrieved from the current sensor 23b to the microcomputer 25-is equal to or smaller than the threshold resistance value RTH.

After the start of the learning session was notified to the microcomputer 25, the learning operation is performed, in addition to the dead short detection operation, to collect the resistance value R of the power supply system 41 and the resistance values Ra1, Ra2–Re of the branch harnesses 19a1, 19a2–19e, the data to be used as decision criteria for determining the occurrence of rare short and leakage.

In this learning operation, each time the current value A of the power supply system 41 that has changed as the result of activation of the loads 17a1, 17a2–17e and the current values Aa1, Aa2–Ae of the branch harnesses 19a1, 19a2–19e connected to the activated loads 17a1, 17a2–17e are taken into the microcomputer 25 from the current sensors 23b, 23e, the resistance value R of the power supply system 41 and the resistance values Ra1, Ra2–Re of the branch harnesses 19a1, 19a2–19e connected to the activated loads 17a1, 17a2–17e-which are calculated by dividing the voltage of the battery 3 from the voltage sensor 23d with the current value A and the current values Aa1, Aa2–Ae-are linked, one on one, to the titles, such as names, codes or numbers, of the activated loads 17a1, 17a2–17e and stored in the RAM 25b.

In this learning session, it is possible to collect all the necessary data, such as the resistance value R of the power supply system 41 produced as a result of the activation of the loads 17a1, 17a2–17e and the resistance values Ra1, Ra2–Re of the branch harnesses 19a1, 19a2–19e connected to the activated loads 17a1, 17a2–17e, by activating the loads 17a1, 17a2–17e one at a time in succession, calculating the resistance value R and the resistance values Ra1, Ra2–Re based on the current value A from the current sensor 23b by the microcomputer 25, and then storing these resistance values in the RAM 25b.

This makes it advantageous also in determining the resistance value R of the power supply system 41 when multiple loads 17a1, 17a2–17e are activated at once With the elapse of a specified period after the start of the learning session was notified to the microcomputer 25, a learning stop operation is performed to notify the end of the learning session to the microcomputer 25, the learning stop operation being a special combination of operations of the beam switch 27 and the wiper switch 29 which is different from that of the learning start operation.

After the end of the learning session has been notified to the microcomputer 25, the rare short/leakage detection operation in addition to the dead short detection operation is performed by checking whether the resistance value R of the power supply system 41 and the resistance values Ra1, Ra2–Re of the branch harnesses 19a1, 19a2–19e, both calculated by the microcomputer 25 based on measurements from current sensors, coincide with the resistance value R and the resistance values Ra1, Ra2–Re collected and stored in the RAM 25b during the learning session.

If, during the dead short detection operation, the resistance value R obtained by dividing the voltage of the battery 3 retrieved from the voltage sensor 23d with the current value A retrieved into the microcomputer 25 from the current sensor 23b is equal to or lower than the threshold resistance value RTH, or if, during the rare short/leakage detection operation, the resistance value R of the power supply system 41 and the resistance values Ra1, Ra2–Re of the branch harnesses 19a1, 19a2–19e do not match the corresponding resistance value R and resistance values Ra1, Ra2–Re stored in the RAM 25b, then the main relay 23a is opened to electrically disconnect the battery 3 from the loads 17a1, 17a2–17e.

After the main relay 23a is opened, operating the reset switch 31 closes the main relay 23a. At this time, if a dead short state exists in which the resistance value R is equal to or lower than the threshold resistance value RTH, or if there is a rare short or leakage state in which the resistance value R of the power supply system 41 and the resistance values Ra1, Ra2–Re of the branch harnesses 19a1, 19a2–19e do not match the corresponding resistance value R and the resistance values Ra1, Ra2–Re stored in the RAM 25b, the main relay 23a is opened again.

Hence, in the event of a dead short or of a rare short or leakage, unless the cause of trouble is removed to eliminate the dead short state or the rare short or leakage state, the electrical connection between the battery 3 and the loads 17a1, 17a2–17e remains cut off.

This abnormal current detection apparatus of this invention, as described above, checks whether a rare short or leakage has occurred in the trunk harness 7, auxiliary trunk harness 11, intermediate harnesses 13a–13d and branch harnesses 19a1, 19a2–19e by the following procedure. First, the current flowing through the battery 3 is measured by the current sensor 23b on the trunk harness 7 connecting the battery 3 and the common contact of the ignition switch 5-the branch point into the loads 17a1, 17a2–17e; the voltage of the battery 3 is measured by the voltage sensor 23d; the measured voltage is divided by the current A to determine the resistance value R of the power supply system 41 produced when the loads 17a1, 17a2–17e are activated and also the resistance values Ra1, Ra2–Re of the branch harnesses 19a1, 19a2–19e connected to the activated loads 17a1, 17a2–17e; and then a check is made to determine if these resistance values calculated from the measured quantities match the corresponding resistance values stored in the RAM 25b.

Therefore, by checking whether the resistance value R of the power supply system 41 produced when the loads 17a1, 17a2–17e are activated after the learning session and the resistance values Ra1, Ra2–Re of the branch harnesses 19a1, 19a2–19e connected to the activated loads 17a1, 17a2–17e-both resistance values being calculated from the current value A flowing through the battery 3 and measured by the current sensor 23b-agree with the corresponding resistance value R and resistance values Ra1, Ra2–Re collected and stored in the RAM 25b during the learning session, it is possible to correctly determine whether any changes in the resistance value R of the power supply system 41 and the resistance values Ra1, Ra2–Re of the branch harnesses 19a1, 19a2–19e that occurred after the learning session are normal resistance value changes produced in the harnesses 19a1, 19a2–19e as the result of the activation of the loads 17a1, 17a2–17e or abnormal resistance value changes caused by a rare short or leakage present somewhere in the harnesses 7, 11, 13a–13d, 19a1, 19a2–19e.

Because an abnormal condition such as a rare short or leakage is identified based on the resistance value R of the power supply system 41 and the resistance values Ra1, Ra2–Re of the branch harnesses 19a1, 19a2–19e, it is possible to reliably detect the occurrence of an abnormal condition such as a rare short and leakage without being influenced by the conditions of the battery 3, such as battery voltage variations due to battery voltage fall and environmental variations including ambient temperature changes, which will cause changes in the currents flowing in the overall power supply system 41 and the branch harnesses 19a1, 19a2–19e.

The resistance value R of the power supply system 41 at time of activation of the loads 17a1, 17a2–17e and the resistance values Ra1, Ra2–Re of the branch harnesses 19a1, 19a2–19e connected to the activated loads 17a1, 17a2–17e may be predetermined values stored beforehand in the RAM 25b.

With this method, the resistance value R of the power supply system 41 and the data of the activated loads 17a1, 17a2–17e need to be generated only once for automobiles of the same kind with the same configuration of the power supply system 41, and these resistance data can be copied into the RAMs 25b of the microcomputers 25 of all the cars of the same type or into separate nonvolatile memories that are to be attached externally to these cars, greatly reducing the time and labor required to set the above data in individual cars.

When the resistance value R of the power supply system 41 produced as a result of activation of each load 17a1, 17a2–17e and the resistance values Ra1, Ra2–Re of the branch harnesses 19a1, 19a2–19e connected to the activated loads 17a1, 17a2–17e are set beforehand in the RAM 25b as predetermined values, it is desired that the resistance value R and the resistance values Ra1, Ra2–Re be stored both in the form of individual values as related to each of the loads 17a1, 17a2–17e and in the form of synthesized values corresponding to combinations of loads 17a1, 17a2–17e that may be used simultaneously.

Further, rather than storing all the synthesized values of the resistance value R of the power supply system 41 and the resistance values Ra1, Ra2–Re for combinations of the loads 17a1, 17a2–17e that may be used at the same time, it is possible to store a pattern of combinations of the loads 17a1, 17a2–17e that may be used simultaneously. This method makes the amount of data to be stored in the RAM 25b smaller than when all the synthesized values of the resistance R, Ra1, Ra2–Re for the combinations of the loads that may be used at once are stored.

On the other hand, if a configuration is adopted as in this embodiment, which, each time the current value A retrieved from the current sensor 23b into the microcomputer 25 changes as a result of activation of each load 17a1, 17a2–17e, calculates the resistance value R of the power supply system 41 and the resistance values Ra1, Ra2–Re of the branch harnesses 19a1, 19a2–19e connected to the activated loads 17a1, 17a2–17e by the microcomputer 25 using the changed current value A during the learning session-which is notified to the microcomputer 25 by the learning start and stop operations using special combinations of operations of the beam switch 27 and wiper switch 29-it is possible to omit the time and labor that are required when the predetermined values for the resistance R of the power supply system 41 for each load 17a1, 17a2–17e and for the resistance values Ra1, Ra2–Re of the loads 17a1, 17a2–17e themselves are set in the RAM 25b.

If the above configuration of this embodiment is adopted, wherein the resistance value R of the power supply system 41 produced as a result of activation of each load 17a1, 17a2–17e and the resistance values Ra1, Ra2–Re of the branch harnesses 19a1, 19a2–19e connected to the activated loads 17a1, 17a2–17e are collected and stored in memory by the learning operation, when a user connects a load (not shown) with unknown specification to an idle branch harness 19a1, 19a2–19e, the apparatus of this embodiment can determine a resistance value R of the power supply system 41 produced as a result of normal operation of the load with unknown specification and a resistance of this load itself and store these resistance values in the RAM 25b. This is convenient for the user.

As to the learning session that gathers the resistance value R of the power supply system 41 produced as a result of activation of each load 17a1, 17a2–17e and the resistance values Ra1, Ra2–Re of the branch harnesses 19a1, 19a2–19e connected to the activated loads 17a1, 17a2–17e, it is possible to set the period of learning according to the load, considering that there are loads that are normally used only in a limited season, such as a defogger.

The notification operations to notify the microcomputer 25 of the start or end of the learning session may be omitted by automatically stopping the learning session a predetermined time or a predetermined distance of travel after the notification to the microcomputer 25 of the start of the learning session.

While this embodiment uses two parameters-the resistance value R of the power supply system 41 and the resistance values Ra1, Ra2–Re of the loads 17a1, 17a2–17e themselves-as the decision criteria for determining the occurrence of a rare short or leakage, it is possible not to use one of the parameters. In that case, only one of the two parameters, either the resistance value R or the resistance values Ra1, Ra2–Re, needs to be stored in the RAM 25b.

When only the resistance value R of the power supply system 41 is to be stored in the RAM 25b as the reference data, it is possible to eliminate the means for activating and stopping each load 17a1, 17a2–17e, a means for linking the titles of the loads 17a1, 17a2–17e, such as loads' names, codes or numbers, with the reference data and storing them in the RAM 25b, and the current sensors 23e for the branch harnesses 19a1, 19a2–19e.

Further, if a configuration is adopted as in this embodiment, in which the activation of the loads 17a1, 17a2–17e-which is performed as the learning session collects the resistance value R of the power supply system 41 and the resistance values Ra1, Ra2–Re of the branch harnesses 19a1, 19a2–19e connected to the loads 17a1, 17a2–17e-is performed one load at a time in a predetermined sequence and in which the titles of loads 17a1, 17a2–17e, such as loads' name, codes or numbers, are linked to the reference data and stored in the RAM 25b, the means for detecting the activation and stopping of the loads 17a1, 17a2–17e can be omitted.

The means for opening the main relay 23a when a rare short or leakage is detected, which is employed in this embodiment, may be omitted. But provision of this means ensures correct disconnection from the battery 3 the harnesses 7, 11, 13a–13d, 19a1, 19a2–19e in which a rare short or leakage occurred, thus reliably protecting these harnesses against damages caused by inadvertent overheating or fires.

While in this embodiment, the current sensor 23b and voltage sensor 23d are located on the trunk harness 7 on the load 17a1, 17a2–17e side of the main relay 23a, it is possible to arrange them on the trunk harness 7 on the battery 3 side of the main relay 23a. In other words, the current sensor 23b and the voltage sensor 23d can be installed anywhere on the trunk harness 7.

While this embodiment has the microcomputer 25 installed in the relay box 23, the microcomputer 25 can be arranged, for example, in the ignition switch 5 or joint box 15, or in locations other than the ignition switch 5, joint box 15 or relay box 23.

In this embodiment, the resistance value R of the power supply system 41 and the resistance values Ra1, Ra2–Re of the loads 17a1, 17a2–17e-both collected and stored in the RAM 25b as the reference data of the parameters for determining the occurrence of a rare short or leakage or used as the actually measured values to be compared with the reference data-are influenced not only indirectly by voltage variations of the battery 3 due to temperature changes but also directly by temperature changes which may cause variations of the resistances themselves.

When the reference data are to be collected and stored in the RAM 25b, rather than simply storing the collected resistance value R of the power supply system 41 and resistance values Ra1, Ra2–Re of the loads 17a1, 17a2–17e as is into the RAM 25b, it is possible to measure an ambient temperature by a temperature sensor and store the collected reference data together with the measured temperature in the RAM 25b so that when comparing the measured resistance value R of the power supply system 41 and resistance values Ra1, Ra2–Re of the loads 17a1, 17a2–17e to the reference data, either the reference data or the measured value can be corrected according to the difference between the ambient temperature detected at time of comparison and the measured temperature stored in the RAM 25b which was measured at time of reference data collection.

In this embodiment, we have described an example case of the power supply system 41 in which, when a rare short or leakage is detected, the main relay 23a is opened to electrically disconnect the loads 17a1, 17a2–17e with the fault from the battery 3. It should be understood that the present invention can also be applied to the power supply system in which at detection of a rare short or leakage the electrical connection between the battery 3 and the faulty loads 17a1, 17a2–17e is cut off by a slow blow fuse. In that case, at detection of a rare short or leakage, a current in excess of the melting characteristic is supplied deliberately to forcibly blow the slow blow fuse and the apparatus is reinstated by replacing the blown fuse.

The advantages of this invention may be summarized as follows.

As claimed in claim 1, the method of detecting an abnormal current in automotive wiring harnesses includes the steps of: measuring currents flowing between an automotive battery and power supply wiring harnesses connecting the battery and a plurality of loads; measuring a voltage of the battery; calculating resistance values between the battery and the wiring harnesses based on the measured currents between the battery and the wiring harnesses and the measured battery voltage; and comparing the calculated resistance values between the battery and the wiring harnesses with data on normal resistance values between the battery and the wiring harnesses as produced by each of the loads being activated, to determine whether any abnormal current is flowing in the wiring harnesses.

As claimed in claim 5, the apparatus for detecting an abnormal current in automotive wiring harnesses comprises: a battery current measuring means for measuring currents flowing between an automotive battery and power supply wiring harnesses connecting the battery and a plurality of loads; a battery voltage measuring means for measuring a voltage of the battery; a resistance value calculating means for calculating resistance values between the battery and the wiring harnesses based on the measured currents of the battery current measuring means and the measured voltage of the battery voltage measuring means; a load resistance data holding means for storing and holding data on normal resistance values between the battery and the wiring harnesses as produced by each of the loads being activated; and a resistance value comparison means for determining whether the resistance values between the battery and the wiring harnesses calculated by the resistance value calculating means match the data on the normal resistance values between the battery and the wiring harnesses as produced by each of the loads being activated; wherein when the resistance value comparison means determines that the resistance values between the battery and the wiring harnesses calculated by the resistance value calculating means do not agree with the data on the normal resistance values between the battery and the wiring harnesses as produced by each of the loads being activated, it is decided that an abnormal current is flowing through some of the wiring harnesses.

The abnormal current detection of this invention is based on the fact that the resistance value between the automotive battery and the plurality of wiring harnesses-which in turn connect to a plurality of loads-is uniquely determined according to the activated ones among the loads as long as there are no abnormal conditions in the wiring harnesses such as a rare short or leakage. That is, when the resistance value between the battery and the wiring harnesses changes, the changed resistance value is compared with the data on the normal resistance value as produced by each of the wires being activated to determine whether the change in the resistance value is a result of activation of loads or a result of occurrence of abnormal conditions in the wiring harnesses, such as a rare short or leakage. This check can be done reliably without being influenced by the battery conditions, such as a battery voltage fall or battery voltage variations due to ambient temperature changes or other environmental changes.

According to the method of detecting an abnormal current in automotive wiring harnesses as claimed in claim 2, resistance values between the battery and the wiring harnesses, which are calculated based on the currents between the battery and the wiring harnesses and the battery voltage, both measured when each of the loads is activated, are collected as the resistance value data during a predetermined period and, after the end of the period, a check is performed based on the collected resistance value data to determine whether any abnormal current is flowing in the wiring harnesses.

As claimed in claim 6, the apparatus for detecting an abnormal current in automotive wiring harnesses comprises: a learning period setting means for setting a period of learning; and a load resistance data learning means for storing into the load resistance data holding means the resistance values between the battery and the wiring harnesses calculated during the learning period by the resistance value calculating means and produced by each of the loads being activated; wherein the resistance value comparison means determines after the learning period whether or not the resistance values between the battery and the wiring harnesses calculated by the resistance value calculating means agree with the data on the normal resistance values between the battery and the wiring harnesses as produced by each of the loads being activated and held by the load resistance data holding means.

In a predetermined period, each of the loads is automatically activated to measure the currents between the battery and the wiring harnesses and the battery voltage and, based on the measured currents and battery voltage, resistance values between the battery and the wiring harnesses are automatically calculated and collected and stored as the data on normal resistance values between the battery and the wiring harnesses as produced by each of the loads being activated. This obviates the need to prepare and store beforehand the data on resistance values as produced by each of the loads being activated.

According to the method of detecting an abnormal current in automotive wiring harnesses as claimed in claim 3, the normal resistance value data between the battery and the wiring harnesses as produced by each of the loads being activated are used as resistance values of each of the loads; currents of each of the wiring harnesses are measured; based on the measured currents of the wiring harnesses and the measured battery voltage, resistance values of each of the wiring harnesses connected to the activated loads as produced by each of the loads being activated are calculated as resistance values between the battery and the wiring harnesses; and the calculated resistance values of the wiring harnesses connected to the activated loads and produced by each of the loads being activated are compared with the resistance values of the activated loads to determine whether any abnormal current is flowing in the wiring harnesses.

According to the apparatus for detecting an abnormal current in automotive wiring harnesses as claimed in claim 7, the data held by the load resistance data holding means are resistance values of each of the loads, and the resistance value comparison means determines whether or not the resistance values between the battery and the wiring harnesses calculated by the resistance value calculating means agree with the resistance values of the loads held by the load resistance data holding means.

Because the resistance values of the load are used as the decision criteria for determining whether or not an abnormal current is flowing through the wiring harnesses connected to the loads, the data required for reliably checking the occurrence of abnormal conditions such as a rare short or leakage includes only the resistance value data of the loads and is thus made simple and small in volume. In addition, it is therefore possible to reliably detect anomalies, such as rare shorts or leakage, occurring in the wiring harnesses connected to the loads without being affected by the battery conditions.

According to the method of detecting an abnormal current in automotive wiring harnesses as claimed in claim 4, when it is decided that abnormal currents are flowing through the wiring harnesses, the wiring harnesses through which the abnormal currents are flowing are electrically cut off from the battery.

As claimed in claim 8, the apparatus for detecting an abnormal current in automotive wiring harnesses further comprises: a relay interposed between the battery and the wiring harnesses and made conductive when the resistance values between the battery and the wiring harnesses are normal; and a relay opening means for opening the relay when the resistance value comparison means determines that the resistance values between the battery and the wiring harnesses calculated by the resistance value calculating means do not agree with the data on the normal resistance values between the battery and the wiring harnesses held by the load resistance data holding means and produced by each of the loads being activated.

With this invention, the electrical disconnection between the battery and a plurality of loads, which has been possible only in the event of a dead short, can also be achieved when other anomalies of less severity occur, thus reliably preventing wiring harnesses from being damaged due to rare shorts or leakage.

What is claimed is:

1. A method of detecting an abnormal current in automotive wiring harnesses, comprising the steps of:
   measuring currents flowing between an automotive battery and power supply wiring harnesses connecting the battery and a plurality of loads;
   measuring a voltage of the battery;
   calculating resistance values between the battery and the wiring harnesses based on the measured current between the battery and the wiring harnesses and the measured battery voltage; and
   comparing the calculated resistance values between the battery and the wiring harnesses with data on normal resistance values between the battery and the wiring harnesses as produced by each of the loads being activated, to determine whether any abnormal current is flowing in the wiring harnesses.

2. A method of detecting an abnormal current in automotive wiring harnesses according to claim 1, wherein resistance values between the battery and the wiring harnesses, which are each calculated based on the currents between the battery and the wiring harnesses and the battery voltage and measured when each of the loads is activated, are collected as the resistance value data during a predetermined period and, after the end of the period, a check is performed based on the collected resistance value data to determine whether any abnormal current is flowing in the wiring harnesses.

3. A method of detecting an abnormal current in automotive wiring harnesses according to claim 1, wherein the normal resistance value data between the battery and the wiring harnesses as produced by each of the loads being activated are used as resistance values of each of the loads; currents of each of the wiring harnesses are measured; based on the measured currents of the wiring harnesses and the measured battery voltage, resistance values of each of the wiring harnesses connected to the activated loads as produced by each of the loads being activated are calculated as resistance values between the battery and the wiring harnesses; and the calculated resistance values of the wiring harnesses connected to the activated loads and produced by each of the loads being activated are compared with the resistance values of the activated loads to determine whether any abnormal current is flowing in the wiring harnesses.

4. A method of detecting an abnormal current in automotive wiring harnesses according to claim 1, wherein when it is decided that abnormal currents are flowing through the wiring harnesses, the wiring harnesses through which the abnormal currents are flowing are electrically cut off from the battery.

5. An apparatus for detecting an abnormal current in automotive wiring harnesses, comprising:
   a battery current measuring means for measuring currents flowing between an automotive battery and power supply wiring harnesses connecting the battery and a plurality of loads;
   a battery voltage measuring means for measuring a voltage of the battery;
   a resistance value calculating means for calculating resistance values between the battery and the wiring harnesses based on the measured currents of the battery current measuring means and the measured voltage of the battery voltage measuring means;
   a load resistance data holding means for storing and holding data on normal resistance values between the battery and the wiring harnesses as produced by each of the loads being activated; and
   a resistance value comparison means for determining whether the resistance values between the battery and the wiring harnesses calculated by the resistance value calculating means match the data on the normal resistance values between the battery and the wiring harnesses as produced by each of the loads being activated;
   wherein when the resistance value comparison means determines that the resistance values between the battery and the wiring harnesses calculated by the resistance value calculating means do not agree with the data on the normal resistance values between the battery and the wiring harnesses as produced by each of the loads being activated, it is decided that an abnormal current is flowing through some of the wiring harnesses.

6. An apparatus for detecting an abnormal current in automotive wiring harnesses according to claim 5, further comprising:
   a learning period setting means for setting a period of learning; and
   a load resistance data learning means for storing into the load resistance data holding means the resistance values between the battery and the wiring harnesses calculated during the learning period by the resistance value calculating means and produced by each of the loads being activated,
   wherein the resistance value comparison means determines after the learning period whether or not the resistance values between the battery and the wiring harnesses calculated by the resistance value calculating means agree with the data on the normal resistance values between the battery and the wiring harnesses as produced by each of the loads being activated and held by the load resistance data holding means.

7. An apparatus for detecting an abnormal current in automotive wiring harnesses according to claim 5, wherein the data held by the load resistance data holding means are resistance values of each of the loads, and the resistance value comparison means determines whether or not the resistance values between the battery and the wiring harnesses calculated by the resistance value calculating means agree with the resistance values of the loads held by the load resistance data holding means.

8. An apparatus for detecting an abnormal current in automotive wiring harnesses according to claim 5, further comprising: a relay interposed between the battery and the wiring harnesses and made conductive when the resistance values between the battery and the wiring harnesses are normal; and a relay opening means for opening the relay when the resistance value comparison means determines that the resistance values between the battery and the wiring harnesses calculated by the resistance value calculating means do not agree with the data on the normal resistance values between the battery and the wiring harnesses held by the load resistance data holding means and produced by each of the loads being activated.

* * * * *